(12) United States Patent
Zhou

(10) Patent No.: US 11,145,736 B2
(45) Date of Patent: Oct. 12, 2021

(54) SEMICONDUCTOR DEVICE WITH ELECTRICALLY CONNECTED DOPING REGIONS AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 76 days.

(21) Appl. No.: 15/804,014

(22) Filed: Nov. 6, 2017

(65) Prior Publication Data
US 2018/0130893 A1    May 10, 2018

(30) Foreign Application Priority Data
Nov. 4, 2016   (CN) .......................... 201610961821.0

(51) Int. Cl.
*H01L 21/02* (2006.01)
*H01L 29/45* (2006.01)
(Continued)

(52) U.S. Cl.
CPC .... *H01L 29/456* (2013.01); *H01L 21/823418* (2013.01); *H01L 21/823431* (2013.01);
(Continued)

(58) Field of Classification Search
CPC ........... H01L 21/823418; H01L 29/785; H01L 29/945; H01L 27/0886
See application file for complete search history.

(56) References Cited

U.S. PATENT DOCUMENTS 9,530,851 B1 * 12/2016 Lu .................. H01L 21/823475
2011/0068414 A1   3/2011 Anderson et al.
(Continued)

FOREIGN PATENT DOCUMENTS

JP    H04105359 A    4/1992

OTHER PUBLICATIONS

The European Patent Office (EPO) The Extended European Search Report for 17199815.6 dated Apr. 4, 2018 12 Pages.
(Continued)

*Primary Examiner* — Phuc T Dang
(74) *Attorney, Agent, or Firm* — Anova Law Group, PLLC

(57) ABSTRACT

Semiconductor devices and fabrication methods thereof are provided. An exemplary semiconductor device includes a base substrate; a gate structure group, having a plurality of gate structures, formed over the base substrate; first source/drain doping regions formed in the base substrate between adjacent gate structures; second source/drain doping regions formed in the base substrate at two sides of the gate structure group, respectively; a first conductive layer formed on a surface of each of the first source/drain doping regions. The second source/drain doing regions at one side of the gate structure group are electrically connected with source voltages; and the second source/drain doping regions at other side of the gate structure group are electrically connected with drain voltages.

20 Claims, 3 Drawing Sheets

(51) Int. Cl.
*H01L 29/417* (2006.01)
*H01L 29/78* (2006.01)
*H01L 29/66* (2006.01)
*H01L 21/8234* (2006.01)
*H01L 23/535* (2006.01)
*H01L 27/088* (2006.01)
*H01L 29/08* (2006.01)

(52) U.S. Cl.
CPC .... *H01L 21/823475* (2013.01); *H01L 23/535* (2013.01); *H01L 27/0886* (2013.01); *H01L 29/0847* (2013.01); *H01L 29/41791* (2013.01); *H01L 29/66795* (2013.01); *H01L 29/785* (2013.01)

(56) References Cited

U.S. PATENT DOCUMENTS

| | | | | |
|---|---|---|---|---|
| 2012/0119302 | A1* | 5/2012 | Pei | H01L 21/26586 257/382 |
| 2013/0113027 | A1* | 5/2013 | Chiang | H01L 29/518 257/288 |
| 2013/0292777 | A1 | 11/2013 | Liaw | |
| 2015/0111359 | A1* | 4/2015 | Tsai | H01L 29/66795 438/301 |
| 2015/0194433 | A1* | 7/2015 | Ponoth | H01L 27/0924 326/38 |
| 2016/0020173 | A1 | 1/2016 | Wan | |
| 2016/0204107 | A1 | 7/2016 | Shimbo | |
| 2016/0268414 | A1 | 9/2016 | Park et al. | |
| 2016/0308016 | A1 | 10/2016 | Choi et al. | |
| 2016/0380052 | A1* | 12/2016 | Kim | H01L 27/1211 257/401 |
| 2017/0294540 | A1* | 10/2017 | Hu | H01L 29/7848 |
| 2019/0123170 | A1* | 4/2019 | Lin | H01L 29/66659 |

OTHER PUBLICATIONS

The European Patent Office (EPO) Office Action of 17199815.6 dated Aug. 13, 2020 6 Pages.

* cited by examiner

SEMICONDUCTOR DEVICE WITH ELECTRICALLY CONNECTED DOPING REGIONS AND FABRICATION METHOD THEREOF

CROSS-REFERENCES TO RELATED APPLICATIONS

This application claims the priority of Chinese patent application No. 201610961821.0, filed on Nov. 4, 2016, the entirety of which is incorporated herein by reference.

FIELD OF THE DISCLOSURE

The present disclosure generally relates to the field of semiconductor manufacturing technologies and, more particularly, relates to semiconductor devices and fabrication methods thereof.

BACKGROUND

MOS transistors are one of the most important types of components in modern integrated circuits (ICs). The basic structure of an MOS transistor includes a semiconductor substrate, a gate structure on the surface of the semiconductor substrate; a source region in the semiconductor substrate at one side of the gate structure and a drain region in the semiconductor substrate at another side of the gate structure. The basic principle of the MOS transistor is to apply a bias on the gate structure to control the current in the channel region under the gate structure to generate switch signals.

With the continuous development of the semiconductor technologies, the control ability of the gate structure to the channel region in the conventional MOS transistor is reduced; and a severe leakage current is generated. Fin field-effect transistors (FinFETs) are a new type of multiple-gate devices. A FinFET structure includes a plurality of fins protruding from the surface of the semiconductor substrate, gate structures covering portions of side and top surfaces of the fins, and source regions in the fins at one side of the gate structures and drain regions in the fins at the other side of the gate structures.

Currently, for an analog device, a relatively long channel region is needed to match its requirements. However, the length of the channel region of an individual FinFET is limited by the fabrication process. Thus, a plurality of FinFETs are often connected in serial. A source voltage is applied to the source at one side of the plurality of FinFETs; and a drain voltage is applied to the drain at the other side of the plurality of FinFETs. The channel regions of the plurality of FinFETs are added together to obtain a long channel for the FinFETs.

However, the performance of the existing semiconductor devices having the FinFETs needs further improvements. The disclosed methods and semiconductor devices are directed to solve one or more problems set forth above and other problems in the art.

BRIEF SUMMARY OF THE DISCLOSURE

One aspect of the present disclosure includes a semiconductor device. The semiconductor device includes a base substrate; a gate structure group, having a plurality of gate structures, formed over the base substrate; first source/drain doping regions formed in the base substrate between adjacent gate structures; second source/drain doping regions formed in the base substrate at two sides of the gate structure group, respectively; a first conductive layer formed on a surface of each of first source/drain doping regions. The second source/drain doing regions at one side of the gate structure group are electrically connected source voltages; and the second source/drain doping regions at the other side of the gate structure group are electrically connected drain voltages.

Another aspect of the present disclosure includes a method for forming a semiconductor device. The method includes providing a base substrate; forming a gate structure group, having a plurality of gate structures, over the base substrate; forming first source/drain doping regions in the base substrate between adjacent gate structures and second source/drain doping regions in the base substrate at two sides of the gate structure group, respectively; and forming a first conductive layer on a surface of each of first source/drain doping regions. The second source/drain doing regions at one side of the gate structure group are electrically connected with source voltages; and the second source/drain doping regions at the other side of the gate structure group are electrically connected with drain voltages.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
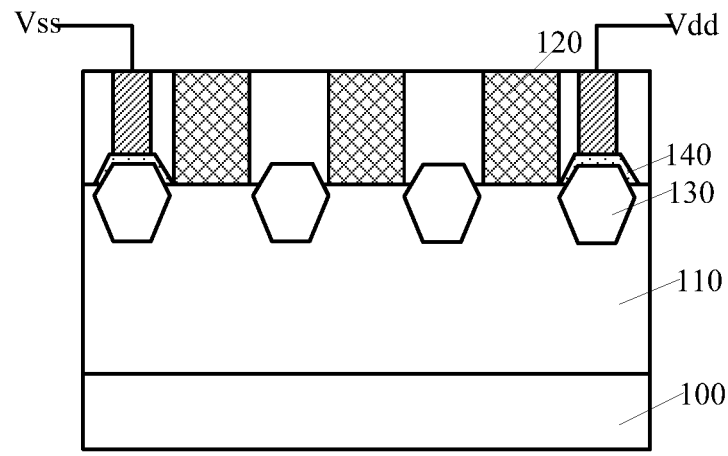
FIG. 1 illustrates a semiconductor device having a plurality of FinFETs connected in serial.

FIG. 1 illustrates a semiconductor device having a plurality of fins connected in serial. The semiconductor device includes a semiconductor substrate 100; a plurality of fins 110 on the semiconductor substrate 100; a gate structure group having a plurality gate structures 120 crossing over the fins 110 and covering portions of the side and top surfaces of the fins 110; source/drain doping regions 130 formed in the fins 110 at two sides of the gate structure group; and metal silicide layers 140 formed on the surfaces of the source/drain doping regions 130 at the two sides of the gate structure group. The metal silicide layers 140 at one side of the gate structure group are electrically connected with source voltages $V_{ss}$; and the metal silicide layers 140 at the other side of the gate structure group are electrically connected with drain voltage $V_{dd}$. The plurality of the FinFETs connected in serial share source/drain doping regions 130.

The electrical properties of such a semiconductor device may not be as desired. With the continuous shrinking of the critical dimension of the semiconductor device, the cross-sectional area of the source/drain doping regions 130 along a direction perpendicular to the length direction of the fins 110 and perpendicular to the semiconductor substrate 100 is continuously reduced. Thus, the resistances between the source/drain doping regions 130 are unable to correspondingly reduce according to the shrinking of the critical dimension of the semiconductor device. That is, the resistances between the source/drain doping regions 130 are greater than the designed resistances. Thus, when the semiconductor device is in operation, the dividing voltage on the source/drain doping regions 130 between adjacent gate structures 120 is relativity large. Under a constant difference between the source voltages $V_{ss}$ and the drain voltages $V_{dd}$, the total voltage for driving the gates structures 120 is relatively small. Thus, the number of gate structures 120 that are able to operate is relatively small. Accordingly, the design range of the number of gate structures 120 is relatively small.

The present disclosure provides a semiconductor device and a fabrication method thereof. The semiconductor device may include a base substrate; a gate structure group having a plurality of gate structures formed on the base substrate; first source/drain doping regions formed in the base substrate between adjacent gate structures; second source/drain doping regions formed in the base substrate at two sides of the gate structure group, respectively; and first conducive layers formed on the surfaces of the first source/drain doping regions. The second source/drain doping regions at one side of the gate structure group may be electrically connect with source voltages; and the second source/drain doping regions at the other side of the gate structure group may be electrically connected with drain voltages In the disclosed semiconductor device, the first conductive layers may be formed on the surfaces of the first source/drain doping regions. The total parallel resistance of the first conductive layers and the first source/drain doping regions may be less than the total parallel resistance of the first source/drain doping regions. Thus, when the semiconductor device is in operation, the dividing voltage on the first source/drain doping regions may be relatively small. Accordingly, under a constant voltage difference between the source voltages and the drain voltages, the total voltage for driving the gate structures to operate normally may be increased. Thus, more number of gate structures may be provided to control the channel regions of the transistors; and the design range of the number of the gate structures may be increased.

Figure 2:
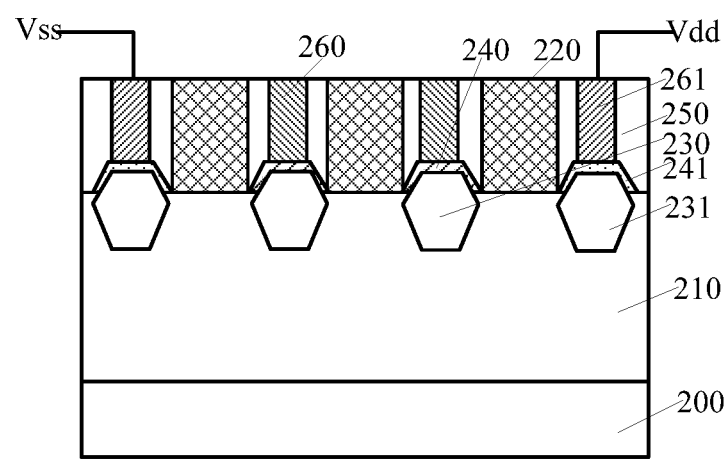
FIG. 2 illustrates an exemplary semiconductor device consistent with the disclosed embodiments.

FIG. 2 illustrates an exemplary semiconductor device consistent with the disclosed embodiments. As shown in FIG. 2, the semiconductor device may include a base substrate, and a gate structure group having a plurality of gate structures 220 formed over the base substrate. The semiconductor device may also include first source/drain doping regions 230 formed in the base substrate at two sides of each of the gate structures 220, respectively; and second source/drain doping regions 231 formed in the base substrate at two sides of the gate structure group, respectively. The second source/drain doping regions 231 at one side of the gate structure group may be electrically connected with source voltages $V_{ss}$; and the second source/drain doping regions 231 at the other side of the gate structure group may be electrically connected with drain voltages $V_{dd}$. Further, the semiconductor device may also include first conductive layers 240 formed on the surfaces of the first source/drain doping regions 230. That is, a first conductive layer 240 may be formed on each of the first source/drain doping regions 230.

In one embodiment, the base substrate includes a semiconductor substrate 200 and a plurality of fins 210 formed on the semiconductor substrate 200. The plurality of fins 210 may protrude from the semiconductor substrate 200. In some embodiments, the semiconductor substrate may be a planar semiconductor substrate. The semiconductor substrate 200 may provide a process platform for forming the semiconductor device.

The semiconductor substrate 200 may be made of any appropriate material. In one embodiment, the semiconductor substrate 200 is made of single crystalline silicon. In some embodiments, the semiconductor substrate may also be made of germanium, silicon germanium, or gallium arsenide, etc.

The number of the fins 210 may be equal to or greater one. When the number of the fins 200 is greater than one, the distribution direction of the plurality of fins 210 may be perpendicular to the length direction of the plurality of fins 210.

The plurality of fins 210 may be made of any appropriate material, such as single crystalline germanium, single crystalline silicon, or single crystalline germanium, etc.

Further, the semiconductor device may also include an isolation structure (not shown) formed on the semiconductor substrate 200. The isolation structure may cover portions of the side surfaces of the fins 210. The isolation structure may be used to electrically isolate adjacent fins 210.

The isolation structure may be made of any appropriate material. In one embodiment, the isolation structure is made of silicon oxide.

In one embodiment, the gate structure group may cover portions of the side surfaces and portions of the top surfaces of the plurality of fins 210. Specifically, the gate structures 220 may cross over the plurality of fins 210; and cover portions of the side and top surfaces of the plurality of fins 210.

In one embodiment, the first source/doping regions 230 may be formed in the fins 210 between the adjacent gate structures 220, respectively. That is, one source/drain doping region 230 may be formed between two adjacent gate structures 220. The second source/drain doping regions 231 may be formed in the fins 210 at two sides of the gate structure group, respectively. That is, one second source/drain doping region 210 may be formed at one side of the gate structure group; and another second source/drain doping region 210 may be formed at the other side of the gate structure group.

The gate structures 220 may also be formed on the isolation structure. The gate structures 220 may include a gate dielectric layer formed on the base substrate and a gate electrode layer formed on the gate dielectric layer.

In one embodiment, the gate dielectric layer may cross over the fins 210. The gate dielectric layer may be formed on portions of the surface of the isolation structure, and portions of side and top surfaces of the fins 210.

The number of the gate structures 220 may be greater than one. For illustrative purposes, in one embodiment, the number of the gate structures 220 is three.

The gate dielectric layer may be made of silicon oxide or high-K dielectric material (the relative dielectric constant is greater than 3.9). The high-K dielectric material may include $HfO_2$, $La_2O_3$, HfSiON, $HfAlO_2$, $ZrO_2$, $Al_2O_3$, $La_2O_3$, or $HfSiO_4$, etc.

When the gate dielectric layer is made of silicon oxide, the gate electrode layer may be made of polysilicon. When the gate dielectric layer is made of the high-K dielectric material, the gate electrode layer may be made of Al, Cu, Ag, Au, Ni, Ti, W, WN, or WSi, etc.

When the semiconductor device is an N-type FinFET device, the first source/drain doping regions 230 and the second source/drain doping regions 231 may be made of SiC; and the first source/drain doping regions 230 and the second source/drain doping regions 231 may be doped with N-type ions, such as As ions, or P ions, etc. When the semiconductor device is a P-type FinFET device, the first source/drain doping regions 230 and the second source/drain doping regions 231 may be made of SiGe; and the first source/drain doping regions 230 and the second source/drain doping regions 231 may be doped with P-type ions, such as B ions, or In ions, etc.

A first conductive layer 240 on a first source/drain doping regions 230 and the first source/drain doping region 230 may be electrically connected in parallel. Thus, the parallel resistance of the conductive layer 240 and the first source/drain doping region 230 may be smaller than the resistance of the source/drain doping region 230. Thus, when the semiconductor device is in operation, the dividing voltage on the first source/drain doping region 240 having the first conductive layer 240 connected in parallel may be relatively low.

The first conductive layers 240 may be formed on the surfaces of the first source/drain doping regions 230. Thus, when the semiconductor device is in operation, the dividing voltage on the first source/drain doping regions 230 may be reduced. Accordingly, under a constant voltage difference between the source voltages Vss and the drain voltages $V_{dd}$, the total voltage that is able to drive the gate structures 220 to control the channel regions may be increased. Thus, more number of gate structures may be provided to operate normally. Thus, the design range of the number of the gate structures 220 may be increased.

In one embodiment, the conductivity of the first conductive layers 240 may be greater than the conductivity of the first source/drain doping regions 230. Comparing with the reduced scale of the total parallel resistance of the first source/drain doping regions 230 and the first conductive layers 240, the reduced scale of the resistance of the first source/drain doping regions 230 may be greater. Thus, the reduced scale of the dividing voltage on the first source/drain doping regions 230 may be relatively large. Therefore, the number of the gate structures 220 that are able to control the channel regions may be further increased. Accordingly, the design range of the number of the gate structures 220 may be further increased.

In some embodiments, the conductivity of the first conductive layers may be smaller than, or equal to the conductivity of the first source/drain doping regions.

The first conductive layers 240 may be made of any appropriate material. In one embodiment, the first conductive layers 240 are made of metal silicide. The metal silicide may include TiSi, NiSi, NiPtSi, or TiPtSi, etc. The thickness of the first conductive layers 240 may be in a range of approximately 20 Å-100 Å.

Further, as shown in FIG. 2, the semiconductor device may also include an interlayer dielectric layer 250. The interlayer dielectric layer 250 may be formed on the surface of the base substrate; and may cover the side surfaces of the gate structures 220. The first conductive layers 240 may be formed in the interlayer dielectric layer 250. Further, the interlayer dielectric layer 250 may also be formed on the first source/drain doping regions 230 and the second source/drain doping regions 231.

In one embodiment, the interlayer dielectric layer 250 may be formed on the semiconductor substrate 200 and the fins 210; and cover the side surfaces of the gate structures 220. Further, the interlayer dielectric layer 250 may also be formed on the first source/drain doping regions 230 and the second source/drain doping regions 231. The interlayer dielectric layer 250 may also be formed on the isolation structure.

The interlayer dielectric layer 250 may be made of any appropriate material, such as silicon oxide, silicon oxynitride, or silicon carbonitride, etc.

Further, as shown in FIG. 2, the semiconductor device may also include first conductive vias 260 and second conductive vias 261. The first conductive vias 260 may be formed on the first conductive layers 240, respectively; and may be in the interlayer dielectric layer 250. That is, a first conductive via 260 may be formed on each of the first conductive layers 240. The second conductive vias 261 may be formed over second source/drain doping regions 231, respectively; and may be in the interlayer dielectric layer 250. That is, a second conductive via 261 may be formed on each of the second source/drain doping region 231.

The second conductive vias 261 at one side of the gate structure group may be electrically connected with the source voltages $V_{ss}$. The second conductive vias 261 at the other side of the gate structure group may be electrically connected with the drain voltages $V_{dd}$.

The first conductive vias 260 and the second conductive vias 261 may be made of metal material, such as W, Cu, or Al, etc.

Further, as shown in FIG. 2, in some embodiments, the semiconductor device may also include second conductive layers 241. The second conductive layers 241 may be formed between the second source/drain doping regions 231 and the second conductive vias 261, and in the interlayer dielectric layer 250. That is, one second conductive layer 241 may be formed between one second source/drain doping region 231 and one corresponding second conductive via 261. The conductivity of the second conductive layers 241 may be between the conductivity of the second source/drain doping regions 231 and the conductivity of the second conductive vias 261.

The second conductive layers 241 may be used to reduce the contact resistance between the second source/drain doping regions 231 and the second conductive vias 261.

The second conductive layers 241 may be made of any appropriate material. In one embodiment, the second conductive layers 241 is made of metal silicide. The thickness of the second conductive layers 241 may be in a range of approximately 20 Å-100 Å.

The transistors corresponding to each of the gate structures 220 may be connected in serial. No voltage may be applied to the first conductive vias 260.

The present disclosure also provides a method for fabricating a semiconductor device. The method may be used to form the previously described semiconductor device, or other semiconductor devices. The method may include providing a base substrate; and forming a gate structure group having a plurality of gate structures over the base substrate. The method may also include forming first source/drain doping regions and second source/drain doping regions in the base substrate. The first source/drain regions may be formed in the base substrate between adjacent gate structures, respectively; and the second source/drain doping regions may be formed in the base substrate at two side of the gate structure group, respectively. The second source/drain doping regions at one side of the gate structure group may be electrically connected with source voltages; and the second source/drain doping regions at the other side of the gate structure group may be electrically connected with drain voltages. Further, the method may also include forming a first conductive layer on the surface of each of the first source/drain doping regions.

Figure 6:
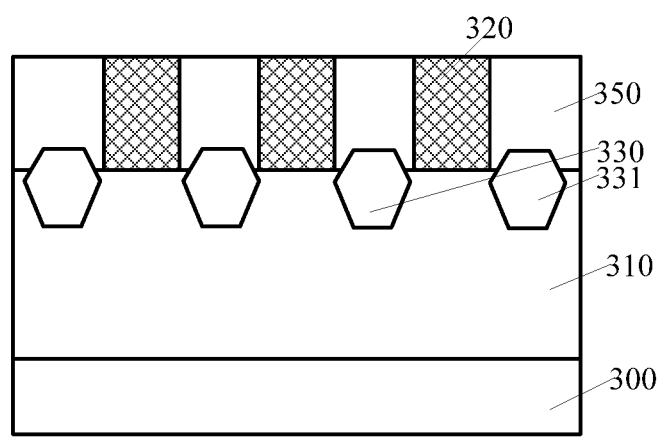
Figure 7:
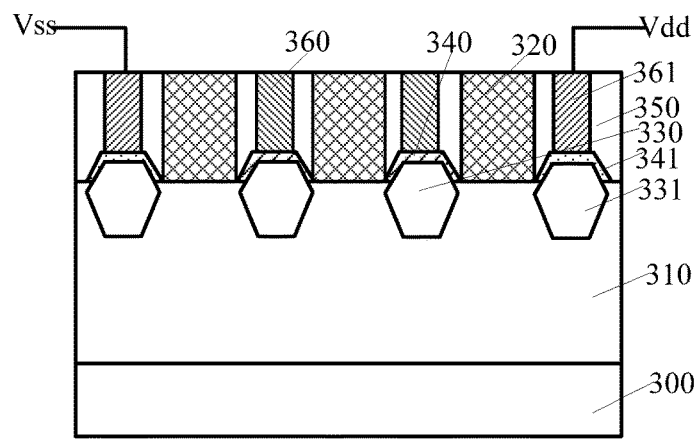
Figure 8:
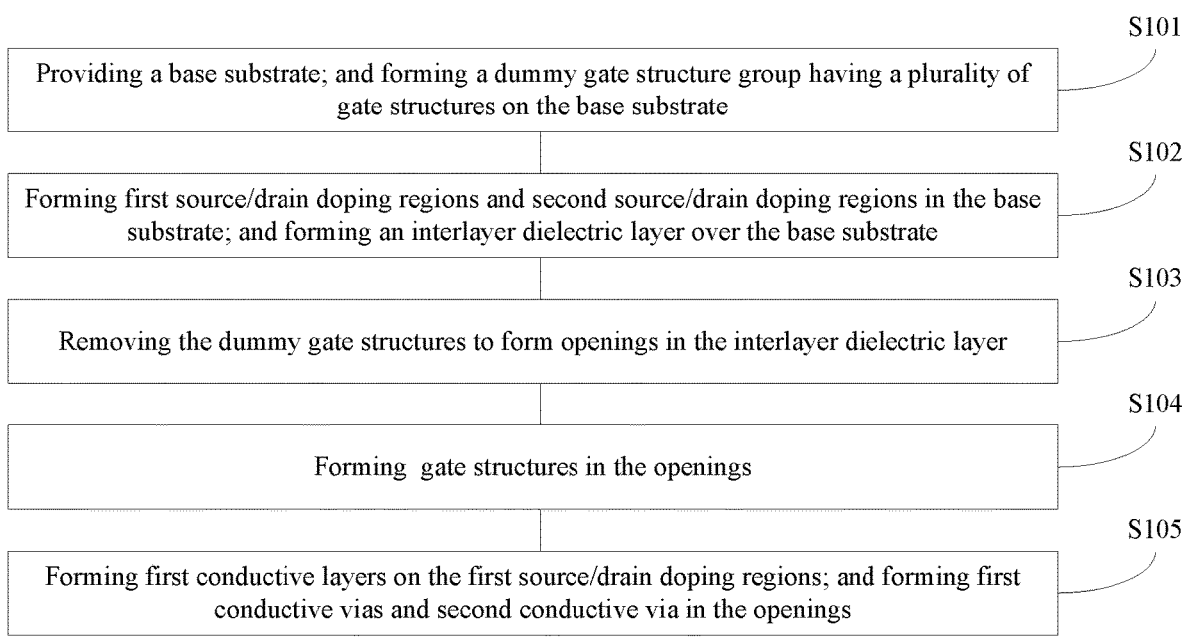
FIG. 8 illustrates an exemplary fabrication process of a semiconductor device consistent with the disclosed embodiments.

FIG. 8 illustrates an exemplary fabrication process of a semiconductor device according to the disclosed embodiments. FIGS. 3-7 illustrate semiconductor structures corresponding certain stages of the exemplary fabrication process. For illustrative purposes, a gate-last process is described herein.

Figure 3:
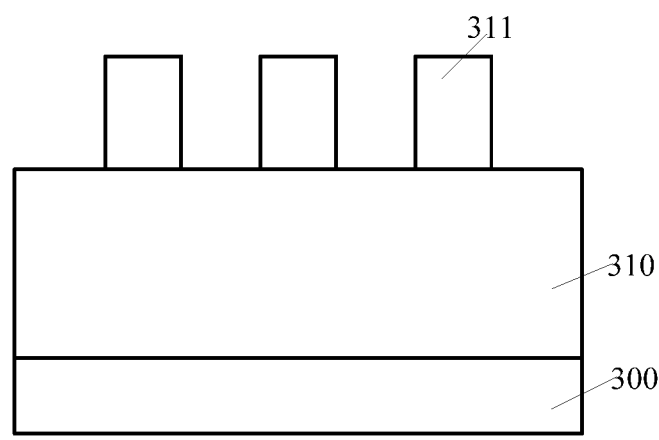
FIGS. 3-7 illustrate semiconductor structures corresponding to certain stages of an exemplary fabrication process of a semiconductor device consistent with the disclosed embodiments.

As shown in FIG. 8, at the beginning of the fabrication process, a base substrate with certain structures is provided (S101). FIG. 3 illustrates a corresponding semiconductor structure.

As shown in FIG. 3, a base substrate is provided. The base substrate may include a semiconductor substrate 300 and a plurality of fins 310 formed on the semiconductor substrate 300. The plurality of fins 310 may protrude from the semiconductor substrate 300. In some embodiments, the semiconductor substrate may be a planar semiconductor substrate. The semiconductor substrate 300 may provide a process platform for forming the semiconductor device.

The semiconductor substrate 300 may be made of any appropriate material. In one embodiment, the semiconductor substrate 300 is made of single crystalline silicon. In some embodiments, the semiconductor substrate may be made of germanium, silicon germanium, or gallium arsenide, etc.

The number of the fins 310 may be equal to, or greater than one. When the number of the fins 310 is greater than one, the distribution direction of the plurality of fins 310 may be perpendicular to the length direction of the plurality of fins 310.

In one embodiment, the plurality of fins 310 may be formed by patterning the semiconductor substrate 300. In some embodiments, the fins may be formed by forming a fin material layer on the semiconductor substrate, then patterning the fin material layer to form the plurality of fins.

Further, an isolation structure (not shown) may be formed on the semiconductor substrate 300. The isolation structure may cover portions of the side surfaces of the fins 310. The isolation structure may be used to electrically isolate adjacent fins 310.

The isolation structure may be made of any appropriate material. In one embodiment, the isolation structure may is made of silicon oxide.

The process for forming the isolation structure may include forming an isolation structure film, covering the fins 310 and with a top surface above the top surfaces of the fins 310, over the semiconductor substrate 300; removing portions of the isolation structure film above the top surfaces of the fins 310; and etching-back the remaining isolation structure film after removing portions of the isolation structure film above the top surfaces of the fins 310. Thus, the isolation structure may be formed.

Further, a dummy gate structure group may be formed over the base substrate. The dummy gate structure group may include a plurality of dummy gate structures 311.

In one embodiment, the plurality of dummy gate structures 311 may cross over, and cover portions of the side and top surfaces of the plurality of fins 310. The dummy gate structures 311 may include a dummy gate dielectric layer and a dummy gate electrode layer formed on the dummy gate dielectric layer.

The dummy gate dielectric layer may cross over the fins 310. The dummy gate dielectric layer may be formed on portions of the surface of the isolation structure; and cover portions of the side and top surfaces of the fins 310.

The dummy gate electrode layer may be made of any appropriate material. In one embodiment, the dummy gate electrode layer is made of polysilicon.

The dummy gate dielectric layer may be made of any appropriate material. When the dummy gate electrode layer is subsequently removed to form openings, the dummy gate dielectric layer may be configured as a gate dielectric layer. Thus, in one embodiment, the dummy gate dielectric layer may be made of a high-K dielectric material (K>3.9).

When the dummy gate structures 311 are subsequently removed to form openings, a gate dielectric layer may be subsequently formed in the openings. Thus, in some embodiments, the gate dielectric layer may be made of silicon oxide.

For illustrative purposes, the process for subsequently removing the dummy gate structures 311 is described herein.

Figure 4:
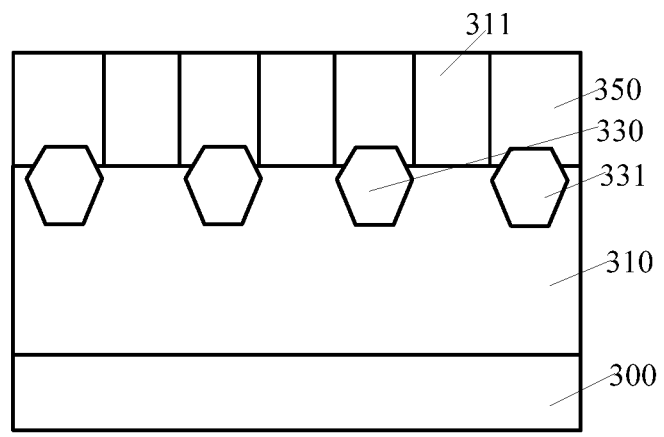

Returning to FIG. 8, after forming the dummy gate structures 311, first source/drain doping regions and second source/drain doping regions may be formed (S102). FIG. 4 illustrates a corresponding semiconductor structure.

As shown in FIG. 4, first source/doping regions 330 may be formed in the base substrate between adjacent dummy gate structures 311, respectively; and second source/drain doping regions 311 may be formed in the base substrate at two sides of the dummy gate structure group, respectively. That is, one first source/drain doping region 330 may be formed between two adjacent dummy gate structures 311, and one second source/drain doping region may be formed at one side of the dummy gate structure group and another second source/drain doping region may be formed at the other side of the dummy gate structure group.

Further, after forming the first source/drain doping regions 330 and the second source drain doping regions 331, an interlayer dielectric layer 350 may be formed over the base substrate. The interlayer dielectric layer 350 may cover the side surfaces of the dummy gate structures 311.

Specifically, the second source/drain doping regions 331 may be formed in the fins 310 at two sides of the dummy gate structure group. The first source/drain doping regions 330 may be formed in the fins 310 between adjacent dummy gate structures 311. After forming the first source/drain doping regions 330 and the second source/drain doping regions 331, the interlayer dielectric layer 350 covering the side surfaces of the dummy gate structures 311 may be formed over the isolation structure and the fins 310. The interlayer dielectric layer 350 may also cover the first source/drain doping regions 330 and the second source/drain doping regions 331.

When the semiconductor device is an N-type FinFET device, the first source/drain doping regions 330 and the second source/drain doping regions 331 may be made of SiC; and the first source/drain doping regions 330 and the second source/drain doping regions 331 may be doped with N-type ions, such as As ions, or P ions, etc. When the semiconductor device is a P-type FinFET device, the first source/drain doping regions 330 and the second source/drain doping regions 331 may be made of SiGe; and the first source/drain doping regions 330 and the second source/drain doping regions 331 may be doped with P-type ions, such as B ions, or In ions, etc.

The process for forming the first source/drain doping regions 330 and the second source/drain doping regions 331 may include forming first trenches in the fins 310 between adjacent dummy gate structures 311; forming second trenches in the fins 310 at two the sides of the dummy gate structure group; forming a first source/drain material layer in the first trenches to form the first source/drain doping regions 330 by an epitaxial growth process; and forming a second source/drain material layer in the second trenches to form the second source/drain doping regions 331 by an epitaxial growth process.

The interlayer dielectric layer 350 may be made of any appropriate material, such as silicon oxide, silicon nitride, or silicon oxynitride, etc.

The process for forming the interlayer dielectric layer 350 may include forming an interlayer dielectric material film to cover the dummy gate structures 311 on the isolation structure and the fins 310. The top surface of the interlayer dielectric material film may be above the top surfaces of the dummy gate structures 311. Then, the portions of the interlayer dielectric material film above the dummy gate structures 311 may be removed; and the interlayer dielectric layer 350 may be formed.

Figure 5:
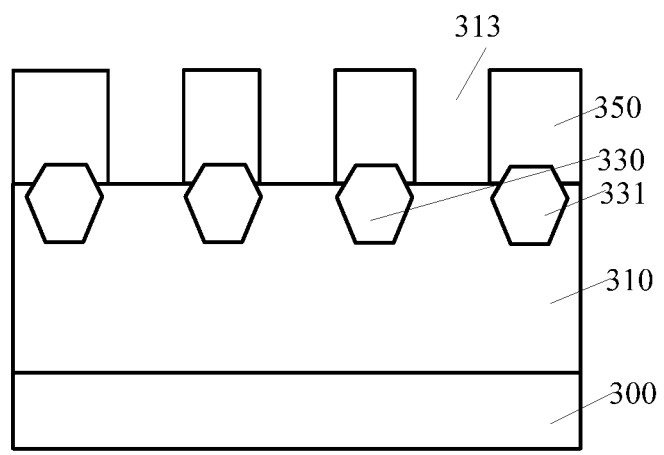

Returning to FIG. 8, after forming the interlayer dielectric layer 350, the dummy gate structures 311 (referring to FIG. 4) may be removed (S103). FIG. 5 illustrates a corresponding semiconductor structure.

As shown in FIG. 5, the dummy gate structures 311 are removed; and openings 313 may be formed in the interlayer dielectric layer 350. The openings 313 may expose portions of the top surfaces of the fins 310.

The dummy gate structures 311 may be removed by any appropriate process, such as a dry etching process, a wet etching, or a combination of a dry etching process and a wet etching process, etc.

Returning to FIG. 8, after removing the dummy gate structures 311 to form the openings 313, gate structures may be formed (S104). FIG. 6 illustrates a corresponding semiconductor structure.

As shown in FIG. 6, a gate structure 320 is formed in each of the openings 313. The process for forming the gate structures 320 may include forming a gate dielectric material layer on the bottom and side surfaces of the openings 313 and the top surface of the interlayer dielectric layer 350; forming a gate electrode material layer on the gate dielectric material layer; and planarizing the gate electrode material layer and the gate dielectric material layer until the top surface of the interlayer dielectric layer 350 is exposed. Thus, the plurality of gate structures 320 may be formed. The plurality of adjacent gate structures 320 may form a gate structure group. In one embodiment, the plurality of gate structures 320 may cross over the plurality of fins 310; and may cover portions of the side and top surfaces of the plurality of fins 310.

The gate structures 320 may include a gate dielectric layer and a gate electrode layer formed on the gate dielectric layer.

The gate dielectric layer may cross over the fins 310. The gate dielectric layer may be formed on portions of the surface of the isolation structure, and cover portions of the side and top surfaces of the fins 310.

The gate dielectric layer may be made of silicon oxide or a high-K dielectric material (the relative dielectric constant is greater than 3.9). The high-K dielectric material may include $HfO_2$, $La_2O_3$, $HfSiON$, $HfAlO_2$, $ZrO_2$, $Al_2O_3$, $La_2O_3$, or $HfSiO_4$, etc. The gate electrode layer may be made of Al, Cu, Ag, Au, Ni, Ti, W, WN, or WSi, etc.

Returning to FIG. 8, after forming the gate structures 320, first conductive layers, first conductive vias and second conductive vias may be formed (S105). FIG. 7 illustrates a corresponding semiconductor structure.

As shown in FIG. 7, a first conducive layer 340 may be formed on each of the first source/drain doping regions 330; and a first conductive via 360 may be formed on each of the first conductive layers 340. Further, a second conductive via 361 may be formed over each of the second source/drain doping regions 331. In some embodiments, a second conductive layer 341 may be formed on each of the second source/drain doping region 331; and the second conductive vias 361 may be formed on the second conductive layers 341.

The process for forming the first conductive vias 360 and the second conductive vias 361 may include forming first through-holes exposing the first source/drain doping regions 330 and second through-holes exposing the second source/drain doping regions 331 in the interlayer dielectric layer 350; forming the first conductive layer 340 on each first source/drain doping region 330; and forming the first conductive vias 360 in the first through-holes and the second conductive vias 361 in the second through-holes.

In some embodiments, before forming the first conductive vias and the second conductive vias, the second conductive layers 341 may be formed on the second source/drain doping regions 331. The second conductive vias 361 may be formed in the second through-holes and on the second conductive layers 341.

The second conductive vias 361 at one side of the gate structure group may be used to electrically connect the source voltages $V_{ss}$. The second conductive vias 361 at the other side of the gate structure group may be used to connect the drain voltages $V_{dd}$.

The first conductive vias 360 and the second conductive vias 361 may be made of metal material, such as W, Cu, or Al, etc.

The first conductive layers 340 on the first source/drain doping regions 330 and the corresponding first source/drain doping regions 330 may be electrically connected in parallel. Thus, the total parallel resistance of the first conductive layers 340 and the first source/drain doping regions 330 may be smaller than the resistance of the source/drain doping regions 330. Thus, when the semiconductor device is in operation, the dividing voltage on the first source/drain doping regions 330 having the first conductive layers 340 connected in parallel may be relatively small.

The first conductive layers 340 may be formed on the surfaces of the first source/drain doping regions 330. Thus, when the semiconductor device is in operation, the dividing voltage on the first source/drain doping regions 330 may be reduced. Accordingly, under a constant voltage difference between the source voltages $V_{ss}$ and the drain voltages $V_{dd}$, the total voltage that is able to drive the gate structures 320 to operate normally may be increased. Thus, more number of gate structures 320 may be provided to control the channel regions. Thus, the design range of the number of gate structures 320 may be increased.

In one embodiment, the conductivity of the first conductive layers 340 may be greater than the conductivity of the first source/drain doping regions 330. Comparing with the reduced scale of the total parallel resistance of the first source/drain doping regions 330 and the first conductive layers 340, the reduced scale of the resistance of the first source/drain doping regions 330 may be greater. Thus, the reduced scale of the dividing voltage on the first source/drain doping regions 330 may be relatively large. Therefore, the number of the gate structures 320 that are able to control the channel regions may be further increased. Accordingly, the design range of the number of the gate structures 320 may be further increased.

In some embodiments, the conductivity of the first conductive layers may be smaller than, or equal to the conductivity of the first source/drain doping regions.

The first conductive layers 340 may be made of any appropriate material. In one embodiment, the first conductive layers 340 are made of metal silicide. The metal silicide may include TiSi, NiSi, NiPtSi, or TiPtSi, etc. The thickness of the first conductive layers 340 may be in a range of approximately 20 Å-100 Å.

Referring to FIG. 7, the conductivity of the second conducive layers 341 may be between the conductivity of the second source/drain doping regions 331 and the conductivity of the second conductive vias 361. After forming the second conductive vias 361, the second conductive vias 361 may be between the second conductive vias 361 and the second source/drain doping regions 331. The second conductive layers 341 may be able to reduce the contact resistance between the second source/drain doping regions 331 and the second conductive vias 361.

The second conductive layers 341 may be made of any appropriate material. In one embodiment, the second conductive layers 341 are made of metal silicide. The thickness of the second conductive layers 341 may be in a range of approximately 20 Å-100 Å.

When the first conductive layers 340 and the second conductive layers 341 are made of metal silicide, the method for forming the first conductive layers 340 and the second conductive layers 341 may include forming a metal layer (not labeled) on the surfaces of the first source/drain doping regions 330 exposed by the first through holes, the side surfaces of the first through-holes, the surfaces of the second source/drain doping regions 331 exposed by the second through-holes, the side surfaces of the second through-holes and the top surface of the interlayer dielectric layer 350; performing a thermal annealing process to cause the metal layer on the surfaces of the first source/drain doping regions 330 to react with the first source/drain doping regions 330 to form the first conducive layers 340, and to cause the metal layer on the surfaces of the second source/drain doping regions 331 to react with the second source/drain doping regions 331 to form the second conducive layers 341; and removing the metal layer on the side surfaces of the first through-holes, the side surfaces of the second through-holes and the top surface of the interlayer dielectric layer 350.

The metal layer may be formed by any appropriate process, such as a deposition process, etc. The deposition process may be a sputtering process, etc.

The metal layer on the side surfaces of the first through-holes, the side surfaces of the second through-holes and the top surface of the interlayer dielectric layer 350 may be removed by any appropriate process, such as a wet etching process, or a dry etching process, etc.

The transistors corresponding to each of the gate structures 320 may be connected in serial. No voltage may be applied to the first conductive vias 360.

In some embodiments, the method for forming the semiconductor device may include providing a base substrate and forming a gate structure group having a plurality of gate structures on the base substrate. The method may also include forming first source/drain doping regions between adjacent gate structures; and forming second source/drain doping regions in the base substrate at two sides of the gate structure group. The second source/drain doping regions at one side of the gate structure group may be electrically connected with the source voltages; and the second source/drain doping regions at the other side of the gate structure group may be electrically connected with drain voltages.

After forming the first source/drain doping regions, first conductive layers may be formed on the surfaces of the first source/drain doping regions.

The gate structures may include a gate dielectric layer formed on the surface of the base substrate; and a gate electrode layer formed on the surface of the gate dielectric layer. Under such a configuration, the gate dielectric layer may be made of silicon oxide or a high-K dielectric material (K>3.9). When the gate dielectric layer is made silicon oxide, the gate electrode layer may be made of polysilicon. When the gate dielectric layer is made of the high-K dielectric material, the gate electrode layer may be made of Al, Cu, Ag, Au, Ni, Ti, W, WN or WSi, etc.

After forming the first source/drain doping regions and the second source/drain doping regions and before forming the first conductive layers, an interlayer dielectric layer covering the side surfaces of the gate structures may be formed on the surface of the base substrate; and first through-holes and second through-holes may be formed in the interlayer dielectric layer. The first through-holes may expose the surfaces of the first source/drain doping regions; and the second through-holes may expose the surfaces of the second source/drain doping regions. Then, first conductive layers may be formed on the first source/drain doping regions exposed by the first through-holes; and first conducive vias may be formed in the first through-holes; and second conductive vias may be formed in the second through holes.

After forming the first through-holes and the second through-holes and before forming the first conductive vias and the second conductive vias, second conductive layers may be formed on the second source/drain doping regions exposed by the second through-holes. The conductivity of the second conductive layers may be between the conductivity of the second source/drain doping regions and the conductivity of the second conductive layers. After forming the second conductive vias, the second conductive layers may be between the second conducive vias and the second source/drain doping regions.

The second conductive vias at one side of the gate structure group may be electrically connected with the source voltages $V_{ss}$. The second conductive vias at the other side of the gate structure group may be electrically connected with the drain voltages $V_{dd}$.

Comparing with the existing techniques, the disclosed semiconductor devices and fabrication methods may have following advantages.

For example, in the disclosed semiconductor devices, the first conductive layers may be formed on the surfaces of the first source/drain doping regions. The total parallel resistance of the first conductive layers and the first source/drain doping regions may be smaller than the resistance of the first source/drain doping regions. Thus, the dividing voltage on the first source/drain doping regions may also be relatively small. Thus, under a constant voltage difference between the source voltages and the drain voltages, the total voltage that is able to drive the gate structures to operate may be increased; more number of the gate structures may be provided to operate. Accordingly, the design range of the number of the gate structures may be increased.

Further, the conductivity of the first conductive layers may be greater than the conductivity of the first source/drain doping regions. Thus, the reduced scale of the total parallel resistance of the first conducive layers and the first source/drain doping regions may be greater than the reduced scale of the resistance of the first source/drain doping regions. Thus, the reduced scale of the dividing voltage on the first sourced/drain doping regions may be relatively large. The number of the gate structures that are able to control the channel regions may be further increased; and the design range of the number of the gate structures may be increased.

In the disclosed fabrication methods of the semiconductor devices, the first conductive layers may be formed on the surfaces of the first source/drain doping regions. The total parallel resistance of the first conductive layers and the first source/drain doping regions may be smaller than the resistance of the first source/drain doping regions. Thus, the dividing voltage on the first source/drain doping regions may be relatively small. Therefore, under a constant voltage difference between the source voltages and the drain voltages, the total voltage that is able to drive the gate structures to operate may be increased; and more number of the gate structures may be provided to control the channel regions. Accordingly, the design range of the number of the gate structures may be increased.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising:
a base substrate;
a gate structure group, having a plurality of gate structures, formed over the base substrate;
first source/drain doping regions formed in the base substrate between adjacent gate structures;
two second source/drain doping regions formed in the base substrate at two sides of the gate structure group, respectively, each of the first source/drain doping regions and each of the second source/drain doping regions having a top surface and two angled side surfaces protruding from a top surface of the base substrate, respectively, a portion of the two angled side surfaces of the first source/drain doping regions and a portion of the two angled side surfaces of the two second source/drain doping regions being exposed by the base substrate, and a remaining portion of the two angled side surfaces of the first source/drain doping regions and a remaining portion of the two angled side surfaces of the two second source/drain doping regions being covered by the base substrate;
a first conductive layer formed on each of the first source/drain doping regions, wherein the first conductive layer completely covers the top surface and the portion of the two angled side surfaces of each of the first source/drain doping regions exposed by the base substrate;
a second conductive layer formed on each of the two second source/drain doping regions, wherein the second conductive layer completely covers the top surface and the portion of the two angled side surfaces of each of the two second source/drain doping regions exposed by the base substrate; and
a first conductive via formed over each of the first conductive layers and a second conductive via formed over each of the second conductive layers, wherein:
the first source/drain doping regions between adjacent gate structures are floating;
a first of the two second source/drain doing regions at one side of the gate structure group is electrically connected with a source voltage through a corresponding first conductive via; and
a second of the two second source/drain doping regions at other side of the gate structure group is electrically connect with drain voltage through a corresponding first conductive via.

2. The semiconductor device according to claim 1, wherein:
a conductivity of the first conducive layers is greater than a conductivity of the first source/drain doping regions.

3. The semiconductor device according to claim 2, wherein:
the first conductive layers are made of metal silicide.

4. The semiconductor device according to claim 3, wherein:
the first conductive layers are made of one of TiSi, NiSi, NiPtSi and TiPtSi.

5. The semiconductor device according to claim 1, further comprising:
an interlayer dielectric layer formed over the base substrate, the first source/drain doping regions and the two second source/drain doping regions,
wherein:
the interlayer dielectric layer covers the side surfaces of the gate structures; and
the first conductive layers are formed in the interlayer dielectric layer.

6. The semiconductor device according to claim 5, wherein:
the first conductive via is formed in the interlayer dielectric layer, and an area of a bottom surface of the first conductive via is smaller than an area of the top surfaces of each of the first source/drain doping regions exposed by the base substrate; and
the second conductive via is formed in the interlayer dielectric layer, and an area of a bottom surface of the second conductive via is smaller than an area of the top surfaces of each of the two second source/drain doping regions exposed by the base substrate.

7. The semiconductor device according to claim 6, wherein:
the first conductive vias and the second conductive vias are made of one of W, Cu and Al.

8. The semiconductor device according to claim 6, wherein:
a conductivity of the first conducive layers between a conductivity of the first source/drain doping regions and a conductivity of the first conductive vias;
a conductivity of the second conducive layers between a conductivity of the two second source/drain doping regions and a conductivity of the second conductive vias;
the second conductive vias at one side of the gate structure group are electrically connected with source voltages; and
the second conductive vias at other side of the gate structure group are electrically connected with the drain voltages.

9. The semiconductor device according to claim 6, wherein:
each second conductive layer being between a second source/drain doping region and a second conductive via, formed in the interlayer dielectric layer, and with a conductivity between a conductivity of the second source/drain doping regions and the second conductive vias.

10. The semiconductor device according to claim 1, wherein the gate structures comprise:
a gate dielectric layer formed over the base substrate; and
a gate electrode layer formed on the gate dielectric layer.

11. The semiconductor device according to claim 1, wherein:
the base substrate is a planar semiconductor substrate.

12. The semiconductor device according to claim 1, wherein the base substrate comprises:
a semiconductor substrate;
a plurality of fins formed on the semiconductor substrate; wherein:
  the gate structures cross over the fins, and cover portions of top and side surfaces of the fins;
  the first source/drain doping regions are formed in the fins between adjacent gate structures; and
  the second source/drain doping regions are formed in the fins at two sides of the gate structure group, respectively.

13. A method for fabricating a semiconductor device, comprising:
providing a base substrate;
forming a gate structure group, having a plurality of gate structures, over the base substrate;
forming first source/drain doping regions in the base substrate between adjacent gate structures;
forming two second source/drain doping regions at two sides of the gate structure group, respectively, wherein each of the first source/drain doping regions and each of the two second source/drain doping regions have a top surface and two angled side surfaces protruding from a top surface of the base substrate, respectively, a portion of the two angled side surfaces of the first source/drain doping regions and a portion of the two angled side surfaces of the two second source/drain doping regions are exposed by the base substrate, and a remaining portion of the two angled side surfaces of the first source/drain doping regions and a remaining portion of the two angled side surfaces of the two second source/drain doping regions are covered by the base substrate;
forming a first conductive layer on each of the first source/drain doping regions, wherein the first conductive layer completely covers the top surface and the portion of the two angled side surfaces of each of the first source/drain doping regions exposed by the base substrate;
forming a second conductive layer on each of the two second source/drain doping regions, wherein the second conductive layer completely covers the top surface and the portion of the two angled side surfaces of each of the two second source/drain doping regions exposed by the base substrate; and
forming a first conductive via formed over each of the first conductive layers and a second conductive via formed over each of the second conductive layers,
wherein:
the first source/drain doping regions between adjacent gate structures are floating.

14. The method according to claim 13, wherein:
a first of the two second source/drain doping regions at one side of the gate structure group are electrically connected with source voltages; and
a second of the two second source/drain doping regions at another side of the gate structure group are electrically connected with the drain voltages.

15. The method according to claim 13, wherein:
a conductivity of the first conductive layers is greater than a conductivity of the first source/drain doping regions.

16. The method according to claim 15, wherein:
the first conductive layers are made of metal silicide.

17. The method according to claim 13, after forming the first source/drain doping regions and the two second source/drain doping regions and before forming the first conductive layers, further comprising:
forming an interlayer dielectric layer covering side surfaces of the gate structures over the base substrate;
forming first through-holes exposing surfaces of the first source/drain doping regions and second through-holes exposing surfaces of the two second source/drain doping regions in the interlayer dielectric layer after forming the gate structure group;
forming a first conductive layer on a surface of each of the first source/drain doping regions exposed by the first through-holes, an area of a bottom surface of the first conductive via is smaller than an area of the top surfaces of each of the first source/drain doping regions exposed by the base substrate; and
forming a first conductive via in each of the first through-holes and a second conductive via in each of the second through-holes, an area of a bottom surface of the second conductive via is smaller than an area of the top surfaces of each of the two second source/drain doping regions exposed by the base substrate.

18. The method according to claim 17, after forming the first through-holes and the second through-holes and before forming the first conductive vias and the second conductive vias, wherein:
a conductivity of the second conductive layers is between a conductivity of the second source/drain doping regions and a conductivity of the second conductive vias; and
the second conductive layers are between the second conductive vias and the second source/drain doping regions after forming the second conductive vias.

19. The method according to claim 18, the first conductive layers and the second conductive layers are made of metal silicide, wherein the first conductive layers and the second conductive layers are formed by:
forming a metal layer on the surfaces of the first source/drain doping regions exposed by the first through-holes, side surfaces of the first through-holes, the surfaces of the two second source/drain doping regions exposed by the second through-holes, side surfaces of the second through-holes, and a top surface of the interlayer dielectric layer;
performing a thermal annealing process to cause the metal layer to react with the first source/drain doping regions to form the first conductive layers and to react with the two second source/drain doping regions to form the second conductive layers; and
removing the metal layer on the side surfaces of the first through-holes, the side surfaces of the second through-holes and the top surface of the interlayer dielectric layer.

20. The method according to claim 13, wherein:
the base substrate is one of a planar semiconductor structure and a semiconductor substrate having a plurality of fins.

* * * * *